*(12)* United States Patent
Fedynyshyn

(10) Patent No.: US 6,680,157 B1
(45) Date of Patent: Jan. 20, 2004

US006680157B1

(54) RESIST METHODS AND MATERIALS FOR UV AND ELECTRON-BEAM LITHOGRAPHY WITH REDUCED OUTGASSING

(75) Inventor: Theodore H. Fedynyshyn, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 41 days.

(21) Appl. No.: 09/687,189

(22) Filed: Oct. 12, 2000

(51) Int. Cl.$^7$ .............................................. G03F 7/004
(52) U.S. Cl. ..................... 430/270.1; 296/324; 296/905
(58) Field of Search ............................. 430/270.1, 296, 430/324, 905

(56) References Cited

U.S. PATENT DOCUMENTS

| | | | |
|---|---|---|---|
| 4,470,874 A | * 9/1984 | Bartush et al. ............. | 156/643 |
| 5,110,983 | 5/1992 | Lau et al. .................... | 562/435 |
| 5,370,969 | 12/1994 | Vidusek ....................... | 430/272 |
| 5,372,912 | * 12/1994 | Allen et al. ................. | 430/270 |
| 5,561,194 | * 10/1996 | Cornett et al. ............. | 525/143 |
| 6,103,447 | * 8/2000 | Chen et al. ............. | 430/270.1 |
| 6,114,462 | 9/2000 | Watanabe et al. | |
| 6,139,920 | * 10/2000 | Smith et al. ................ | 427/510 |
| 6,340,552 | * 1/2002 | Kihara et al. ........... | 430/270.1 |
| 6,340,734 | * 1/2002 | Lin et al. ...................... | 528/15 |
| 6,369,279 | * 4/2002 | Nakashima et al. ........ | 568/630 |

FOREIGN PATENT DOCUMENTS

| | | |
|---|---|---|
| DE | 4207261 | 9/1993 |
| EP | 0 366 590 A2 | 5/1990 |
| EP | 0 849 634 A1 | 6/1998 |
| EP | 0 939 339 A1 | 9/1999 |
| EP | 1 004 568 A2 | 5/2000 |
| EP | 1 033 624 A1 | 9/2000 |
| EP | 1 035 441 A1 | 9/2000 |
| JP | 1187036 | 3/1999 |
| WO | WO99/52957 A1 | 10/1999 |

OTHER PUBLICATIONS

Derwent abstract of International Technical Disclosure TP 58401 A, May 25, 1984.*
"Chemically Amplified Electron–Beam Photoresists", Crivello, J. V. et al., Chem. Mater. 1996, 8, 376–381.*
Fedynyshyn, Theodore H., Kunz, Roderick R., Sinta, Roger F., Goodman, Russell B., and Doran, Scott P. "Polymer Photochemistry at Advanced Optical Wavelengths." J. Vac. Sci. Technol. B 18(6), Nov./Dec. 2000. pp. 3332–3339.
Dentinger, Paul M. "Outgassing of Photoresist Materials at Extreme Ultraviolet Wavelengths." J. Vac. Sci. Technol. B 18(6), Nov./Dec. 2000. pp. 3364–3370.
Chauhan, Maharshi M., and Nealey, Paul R. "Outgassing of Photoresists in Extreme Ultraviolet Lithography." J. Vac. Sci. Technol. B 18(6), Nov./Dec. 2000. pp. 3402–3407.
Capasso, C. et al., "X–ray Induced Mask Contamination and Particulate Monitoring in X–ray Steppers," *J. Vac. Sci. Technol. B*, vol. 14, No. 6, 4336–40 (Nov./Dec. 1996).

Houlihan, F.M. et al., "A Study of Resist Outgassing as a Function of Differing Photoadditives, " *SPIE*, vol. 3678, 264–74 (Mar. 1999).
Houlihan, F.M. et al., "Fundamental Studies of the Effects of Photo–additive Structure on Resist Outgassing," *Journal of Photopolymer Science and Technology*, vol. 12, No. 3, 525–36 (1999).
Houlihan, F.M. et al., "Photogenerators of Sulfamic Acids; Use in Chemically Amplified Single Layer Resists," *Journal of Photopolymer Science and Technology*, vol. 11, No. 3, 419–30 (1998).
Kunz, R.R. and Downs, D.K., "Outgassing of Organic Vapors from 193 nm Photoresists: Impact on Atmospheric Purity Near the Lens Optics," *J. Vac. Sci. Technol. B.*, vol. 17, No. 6, 3330–4 (Nov./Dec. 1999).
Kwong, R. et al., "Reactive Ion Etch Studies of DUV Resists," *SPIE*, vol. 3678, 1209–14 (Mar. 1999).
Nalamasu, O. et al., "193 nm Single Layer Resist Strategies, Concepts, and Recent Results" *J. Vac. Sci. Technol. B.*, vol. 16, No. 6, 3716–21 (Nov./Dec. 1998).
Przybilla, K. et al., "Hexafluoroacetone in Deep UV Resist Chemistry: New Resins, Dissolution Inhibitors and Crosslinkers," *Journal of Photopolymer Science and Technology*, vol. 5, No. 1, 85–92 (1992).
Przybilla, K.J. et al., "Hexafluoroacetone in Resist Chemistry: A Versatile New Concept for Materials for Deep UV Lithography," *SPIE*, vol. 1672, 500–512 (1992).
Fedynyshyn, Theodore H., Kunz, Roderick R., Sinta, Roger F., Goodman, Russell B., and Doran, Scott P. "Polymer Photochemistry at Advanced Optical Wavelengths." 44$^{th}$ International Conference On Electron, Ion, and Photon Beam Technology and Nanofabrication; Rancho Mirage, CA, May 30–Jun. 2, 2000, Abstract of Poster Paper.
Dentinger, Paul M. "Outgassing of Photoresist Materials at Extreme Ultraviolet Wavelengths." 44$^{th}$ International Conference On Electron, Ion, and Photon Beam Technology and Nanofabrication; Rancho Mirage, CA, May 30–Jun. 2, 2000, Abstract of Poster Paper.

* cited by examiner

*Primary Examiner*—Rosemary Ashton
(74) *Attorney, Agent, or Firm*—Thomas J. Engellenner; Reza Mollaaghababa; Nutter McClennen & Fish LLP

(57) ABSTRACT

The present invention pertains to polymeric compositions useful for the suppression or elimination of outgassing of volatile components generated from photoresist polymers during lithographic construction. In resists of the invention, an aromatic compound is mixed with a photoresist composition, such that the aromatic compound suppresses or eliminates outgassing of volatile components upon exposure of the resist to radiation. The aromatic additive is preferably an aromatic polymer and in at least some instances can be substituted with at least one electron-donating group or electron-withdrawing group to enhance its stabilizing effects. In one embodiment, the aromatic compound can be an additive to a resist composition. In another embodiment, the aromatic compound can be incorporated into the polymeric backbone of the resist composition.

46 Claims, No Drawings

RESIST METHODS AND MATERIALS FOR UV AND ELECTRON-BEAM LITHOGRAPHY WITH REDUCED OUTGASSING

This invention was made with government support under Contract Number F 19628-95-C-0002 awarded by the Air Force. The government has certain rights in the invention.

BACKGROUND OF THE INVENTION

The technical field of the invention is lithography and, in particular, methods and materials for advanced lithography using ultraviolet light or particle beams to pattern resist materials.

Generally speaking, "photoresists" are radiation sensitive films used in lithography for transfer of images to substrates. They can form negative or positive images. Conventional manufacturing of integrated circuits has been enabled by high-performance organic polymeric resists that are spin-coated onto a wafer surface. After coating with a photoresist, the coated substrate is exposed to a source of activating radiation. This radiation exposure causes a chemical transformation in the regions of the coated surface that are exposed. After the radiation exposure step, the photoresist is treated with a developer solution to dissolve or otherwise remove either the radiation-exposed or unexposed areas of the resist coating, depending upon the type of photoresist used.

Resist "outgassing" is a concern in advanced lithography and occurs when volatile organic molecules or molecular fragments volatilize from the resist film. This can occur during or after exposure. The outgassing rates for organic resist materials can range from $10^{10}$ to $10^{13}$ molecules/$cm^2$-sec or higher. This outgassing can cause a reduction in the resist film thickness in the exposed region and/or lead to the deposition of organic molecules on the exposure system. Deposition on the lens of the ultraviolet exposure apparatus can change the optical properties of the lens, ultimately affecting the amount of light transmitted through the lens and the imaging quality. Similarly, degradation of electron-beam lithography performance can occur when outgassing of photoresists during exposure degrades the high vacuum needed for this exposure mode. Because of the highly energetic nature of the radiation source, control of resist outgassing during exposure is of particular importance in UV lithography, especially when sub-200 micrometer (e.g., 193 nm, 157 nm and extreme ultraviolet) wavelengths or particle beams (e.g., e-beams) are used.

Examples of resist materials that outgas are poly-methyl methacrylate, poly-t-butyl methacrylate, and poly-t-butyl acrylate, each of which are commonly used in resist technology. It is believed that the organic molecules released by these resists arise from polymer fragmentation due to absorbed exposure energy (either photon or electron). The polymer fragmentation can be caused either by polymer main chain scission, polymer side chain fragmentation, or polymer blocking group deprotection. The first two are a direct result of photon absorption or electron impact while the latter arises from a chemical reaction of photogenerated acids.

At the longer wavelengths currently used in commercial semiconductor lithography, outgassing is largely caused by the break-up of the photoacid generators (PAGs) present in the photoresist material. Various formulations have been proposed to make PAGs less volatile. However, as the wavelength of the radiation becomes shorter in advanced lithography systems, the polymer backbone of the resist itself becomes a primary source of volatile organic molecules. None of the resist systems proposed to date for advanced lithography systems have addressed the basic problem of outgassing at sub-200 nanometer wavelengths.

A need therefore exists for methods and materials that overcome or reduce the outgassing problem as it effects advanced resist technology.

SUMMARY OF THE INVENTION

The present invention pertains to polymeric compositions useful for the suppression or elimination of outgassing of volatile components generated from photoresist polymers during lithographic construction. In resists of the invention, an aromatic compound is mixed with a photoresist composition, such that the aromatic compound suppresses or eliminates outgassing of volatile components upon exposure of the resist to radiation. The aromatic additive is preferably an aromatic polymer and in at least some instances can be substituted with at least one electron-donating group or electron-withdrawing group to enhance its stabilizing effects. In one embodiment, the aromatic compound can be an additive to a resist composition. In another embodiment, the aromatic compound can be incorporated into the polymeric backbone of the resist composition.

The present invention also encompasses methods of lithography based on the surprising discovery that the addition of aromatic compounds can suppress or eliminate the release of volatile by-products generated during advanced lithographic processes. For example, the introduction of poly-p-hydroxystyrene into sub-200 nanometer resist compositions prevents or greatly reduces the release of the volatile by-products. The methods of the invention are applicable to advanced resists formulated for use at sub-200 nm wavelengths, such as 157 nm, as well as extreme ultraviolet (EUV), X-ray and/or particle beam systems.

DETAILED DESCRIPTION OF THE INVENTION

The features and other details of the invention will now be more particularly described and pointed out by the following specifications and examples. All percentages by weight identified herein are based on the total weight of the photosensitive resist composition unless otherwise indicated. It will be understood that the particular embodiments of the invention are shown by way of illustration and not as limitations of the invention. The principle features of this invention can be employed in various embodiments without departing from the scope of the invention.

From a resist viewpoint, advanced energy sources can be categorized as one of two types. Highly penetrating energy beams, such as X-rays, high-kV electrons, and high-energy particle beams, are only partially absorbed by the resist layer with much of the exposure energy passing into the underlying substrate. On the other hand, highly absorbing energy beams, such as sub-200 nanometer UV radiation, EUV radiation and low-kV electrons, are almost fully absorbed by the resist. Both categories of energy sources, however, exacerbate the outgassing problem.

More specifically, there has been considerable interest recently in the use of shorter wavelengths of light in lithography to achieve finer resolution. Unfortunately, most conventional photoresist materials absorb far (or deep) ultraviolet radiation strongly. This is most pronounced at sub-200 micron UV wavelengths (e.g., at 157 nanometers) and extreme ultraviolet (EUV) wavelengths, where the radiation takes the form of soft X-rays (e.g., at wavelengths of 10 to 20 nanometers). While this is advantageous from the standpoint of resist speed (i.e. the exposure dose required to form a pattern) and the associated printing rate, it poses a problem for projection lithography because of the highly non-uniform absorption of this radiation through the photoresist thickness. In present photoresist materials, EUV radiation will not penetrate much beyond a film thickness of about 0.10 to 0.15 micrometers. Yet, to fabricate holes and other structures in semiconductor materials such as silicon, as well as metals, or dielectrics, the photoresist layer must be thick enough, preferably about 0.5 to about 1.0 micrometers, to withstand etching and/or other processing steps. Accordingly, in order to make use of the increased resolution afforded by advanced lithography systems in the processing and fabrication of small structures, photoresist materials need to address the problem of photonic penetration/etch resistance and yet remain compatible with conventional lithographic processing techniques.

An example of extended optical wavelengths is lithography employing 157 nm ultraviolet radiation. Patterning of resists with 157 nm radiation from an $F_2$ excimer laser represents the next evolutionary step in photolithography. Medium-field, 157 nm systems have already been realized and the first full-field, 157 nm system can be expected in the very near future. Resists for this technology must be capable initially of 100 nanometer resolution and preferably will be extendable to achieve 70 nanometer resolution. Unfortunately, as with the transition to shorter wavelengths in the past, the resist materials developed for longer wavelengths are generally too energy absorbent for practical use as a high resolution, single-layer, resist imageable with 157 nm radiation.

The development of non-novolac based resists was necessary to overcome high novolac absorbance at 248 nm and enable the introduction of 248 nm lithography into IC manufacturing. In a similar manner, 193 nm lithography required the development of new polymer systems to overcome the high 193 nm absorbance of phenolic based polymers. Two different classes of polymers, polyacrylate and polycyclic copolymer based resists were developed, and now compete for predominance in 193 nm lithography. Due to the high absorbance at 157 nm of polyhydroxystyrene, polyacrylate, and polycyclic copolymer based resists, the use of any of these resists is only be possible if the coated resist thickness is under 100 nm. This will place a major strain on the resist to perform outside of its design capabilities.

Resists and polymers behave differently at different wavelengths. This difference in behavior can become dramatic as one moves from 248-nm to 193-nm to 157-nm or even shorter wavelengths for several reasons. In general, the absorbance of the polymer increases as the wavelength is decreased, although the functional groups and degree of conjugation present plays a dominant role in molecular absorptivity. As lithography is extended to 157-nm, photon absorptivity becomes high for most organic polymers.

The effect of photo-absorption on polymers at 157-nm can be quite different than at longer wavelengths. In particular, the photochemistry at 248-nm in 248-nm resists is driven mainly by photoacid generators ("PAG"), while at 157-nm it is likely that the resist will have a base polymer that directly undergoes photo-induced transformations such as crosslinking, thus counteracting photoacid induced catalytic deprotection of the polymer.

Polymer photochemistry involves photon absorption, which leads to the production of an excited electronic state of the polymer. If the excitation level is greater than the bond dissociation energy, the excited polymer can dissociate into free radical fragments that can then further react to produce chain scission or polymer crosslinking. The energy associated with specific wavelengths of light increases as the wavelength is decreased, going from 115 to 147 to 182 kcal per mole at 248-nm, 193-nm, and 157-nm respectively. This level of energy can be compared with typical carbon-carbon bond dissociation energies of 90 to 120 kcal per mole. The higher energy associated with 157-nm light consequently leads to an increased excited state population and high quantum yields of photoproducts.

The final photochemical reaction products are dependent on the product of the reaction quantum yield and the amount of absorbed incident dose. The amount of polymer backbone chemistry varies between the 3 lithographic wavelengths, as both higher absorbance and increased quantum yield at lower wavelengths act in concert to yield an increased level of polymer backbone chemistry. The degree in which different resists and polymers respond to this light energy and the pathway in which the photochemical reaction leads, be it chain scission or crosslinking, will greatly influence the ability of resists designed at 248-nm or 193-nm to operate as 157-nm resists.

The following set of equations can then be applied to determine the quantum yield of either polymer chain scission ($\Phi_S$) or polymer crosslinking ($\Phi_X$). As it is possible that either polymer chain scission or crosslinking or even that concurrent chain scission or crosslinking can occur, the best data fit is determined for each resist or polymer. Either equation 1 or 2 can be used to determine $\Phi_S$ if no crosslinking is observed. If crosslinking is present, equations 3 and 4 need to be solved simultaneously to determine both $\Phi_S$ and $\Phi_X$. In the equations below, $N_A$ is Avogadro's number and the absorbed dose (D) is determined based on incident dose (I), resist thickness, and the polymer absorption.

$$1/M_{n,D} = 1/M_{n,0} + \Phi_S * D/N_A \qquad \text{Equation 1}$$

$$1/M_{w,D} = 1/M_{w,0} + \Phi_S * D/2N_A \qquad \text{Equation 2}$$

$$1/M_{n,D} = 1/M_{n,0} + [\Phi_S - \Phi_X] * D/N_A \qquad \text{Equation 3}$$

$$1/M_{w,D} = 1/M_{w,0} + [\Phi_S/2 - 2\Phi_X] * D/N_A \qquad \text{Equation 4}$$

Resist outgassing during exposure is problematic with currently available photoresist compositions. Resist outgassing is important both in UV lithography (248 nm, 193 nm, and 157 nm) and in vacuum lithographies such as electron beam.

It has been demonstrated with 248 and 193 nm lithography, that photo-products can outgas and condense on the exposure tool lenses, thus degrading transmission. Specifically, for 193 nm materials, it has been found that haloaromatics compounds are usually the most harmful, followed by aromatic and alkly outgassed photoproducts. Because many volatile organic compounds absorb even more highly at 157 nm, the problem is likely to be more severe at this wavelength and the unique compositions of the invention provide a suitable solution to the problem. Similarly, severe outgassing during e-beam lithography can interfere with the establishment of the high vacuums needed for exposure as well as degrade the tool performance. Again, the unique compositions of the present invention circumvent the disadvantage of currently available resists.

The present invention provides methods to reduce resist outgassing by incorporating into the resist, a material (or materials) that can act as either radical scavengers or have the ability to form stabilizing (or stabilized) radicals. This method is useful for reducing resist outgassing at advanced optical wavelengths such as 193, 157, 100, and 70 nm wavelengths and also with EUV, x-ray, and e-beam exposure sources. The phrase "extreme ultraviolet" or (EUV) as used herein is intended to include any photonic radiation system operating at a wavelength below about 100 nanometers.

In one embodiment of the invention, a material that can prevent or limit outgassing is poly-p-hydroxystyrene. Other examples of aromatic polymers that can prevent or limit outgassing are poly-p-hexafluoroisopropylstyrene and poly-m-hexafluoroisopropylstyrene. These are just some examples of those polymers that include an aromatic unit. In certain applications, it can be advantageous to use an aromatic polymer that is substituted with at least one electron-donating group. In other applications, an aromatic polymer that is substituted with at least one electron-withdrawing group can be especially advantageous. The aromatic material can be part of a copolymer or terpolymer or multi-component polymer or added as a homopolymer in the presence of other polymers to suppress outgassing. Specific examples of materials that have been shown to reduce or suppress outgassing are described in detail in the experimental section. These materials do not need to completely stop resist outgassing to be useful.

In general, the amount of outgassing suppression agent (the aromatic compound or aromatic polymer) should be sufficient to reduce or eliminate outgassing of the volatile components of the photoresist material during and/or after exposure to radiation. The amount sufficient to accomplish this can be determined by those of ordinary skill in the art and will depend upon such factors as the thickness of the desired film, the photoresist composition, the wavelength of the energy utilized and the amount of energy expended. Analysis of compositions which contain suitable suppressing agents can determine the level of suppressing agent required to reduce or eliminate the outgassing to acceptable levels. This can be accomplished using standard statistical analysis. Generally, the amount of suppressing agent required to reduce or eliminate the outgassing of volatile components is at least 1% by weight of photoresist (solids), preferably between about 5 to about 99%, more preferably from between about 5 to about 95% and most preferably from between about 20 to about 90% by weight. When the suppressing agent is an aromatic compound directly incorporated into the polymer structure of the resist, the aromatic compound can as high as 100 percent of the composition and preferably will constitute between about 1 and 95 percent, more preferably between about 10 and 90 percent, of the polymer.

The term "aromatic" is well recognized in the art and includes single ring and multiple ring aromatic compounds, e.g., phenyls (aryls) or naphthyls. The term "aromatic polymer" is likewise well recognized in the art and is intended to encompass polymers having one or more aromatic constituents as either part of the polymer backbone or as a pendant group. The phrase "aromatic unit substituted with at least one electron donating group" refers to those compounds, generally polymeric, which are useful for the suppression of outgassing of volatile by-products of resist materials by their ability to donate electrons. The term "aryl" as used herein includes 5- and 6-membered single-ring aromatic groups that can include from zero to four heteroatoms, for example, benzene, pyrrole, furan, thiophene, imidazole, oxazole, thiazole, triazole, pyrazole, pyridine, pyrazine, pyridazine and pyrimidine, and the like.

Aryl groups also include polycyclic fused aromatic groups such as naphthyl, quinolyl, indolyl, and the like. Those aryl groups having heteroatoms in the ring structure can also be referred to as "aryl heterocycles", "heteroaryls" or "heteroaromatics". The aromatic ring can be substituted at one or more ring positions with such substituents as described above, as for example, halogen, hydroxyl, alkoxy, alkylcarbonyloxy, arylcarbonyloxy, alkoxycarbonyloxy, aryloxycarbonyloxy, carboxylate, alkylcarbonyl, alkoxycarbonyl, aminocarbonyl, alkylthiocarbonyl, alkoxyl, phosphate, phosphonato, phosphinato, cyano, amino (including alkyl amino, dialkylamino, arylamino, diarylamino, and alkylarylamino), acylamino (including alkylcarbonylamino, arylcarbonylamino, carbamoyl and ureido), amidino, imino, sulfhydryl, alkylthio, arylthio, thiocarboxylate, sulfates, sulfonato, sulfamoyl, sulfonamido, nitro, trifluoromethyl, cyano, azido, heterocyclyl, aralkyl, or an aromatic or heteroaromatic moiety. Aryl groups can also be fused or bridged with alicyclic or heterocyclic rings which are not aromatic so as to form a polycycle (e.g., tetralin).

The term "alkyl group" is art recognized and is intended to include hydrocarbon chains, generally having between about one and twenty carbon atoms. Unless the number of carbons is otherwise specified, "lower alkyl" as used herein means an alkyl group, as defined above, but having from one to ten carbons, more preferably from one to six carbon atoms in its backbone structure. Preferred alkyl groups are lower alkyls.

The terms "heterocyclyl" or "heterocyclic group" refer to 3- to 10-membered ring structures, more preferably 4- to 7-membered rings, which ring structures include one to four heteroatoms. Heterocyclyl groups include pyrrolidine, oxolane, thiolane, oxazole, piperidine, piperazine, morpholine, lactones, lactams such as azetidinones and pyrrolidinones, lactones, sultams, sultones, and the like. The heterocyclic ring can be substituted at one or more positions with such substituents as described above, as for example, halogen, hydroxyl, alkylcarbonyloxy, arylcarbonyloxy, alkoxycarbonyloxy, aryloxycarbonyloxy, carboxylate, alkylcarbonyl, alkoxycarbonyl, aminocarbonyl, alkylthiocarbonyl, alkoxyl, phosphate, phosphonato, phosphinato, cyano, amino (including alkyl amino, dialkylamino, arylamino, diarylamino, and alkylarylamino), acylamino (including alkylcarbonylamino, arylcarbonylamino, carbamoyl and ureido), amidino, imino, sulfhydryl, alkylthio, arylthio, thiocarboxylate, sulfates, sulfonato, sulfamoyl, sulfonamido, nitro, trifluoromethyl, cyano, azido, heterocyclyl, aralkyl, or an aromatic or heteroaromatic moiety. A heteroalkyl moiety is an alkyl substituted with a heteroaromatic group.

The terms "polycyclyl" or "polycyclic group" refer to two or more cyclic rings (e.g., cycloalkyls, cycloalkenyls, cycloalkynyls, aryls and/or heterocyclyls) in which two or more carbons are common to two adjoining rings, e.g., the rings are "fused rings". Rings that are joined through non-adjacent atoms are termed "bridged" rings. Each of the rings of the polycycle can be substituted with such substituents as described above, as for example, halogen, hydroxyl, alkylcarbonyloxy, arylcarbonyloxy, alkoxycarbonyloxy, aryloxycarbonyloxy, carboxylate, alkylcarbonyl, alkoxycarbonyl, aminocarbonyl, alkylthiocarbonyl, alkoxyl, phosphate, phosphonato, phosphinato, cyano, amino (including alkyl amino, dialkylamino, arylamino, diarylamino, and alkylarylamino), acylamino (including alkylcarbonylamino, arylcarbonylamino, carbamoyl and ureido), amidino, imino, sulfhydryl, alkylthio, arylthio, thiocarboxylate, sulfates, sulfonato, sulfamoyl, sulfonamido, nitro, trifluoromethyl, cyano, azido, heterocyclyl, alkyl, aralkyl, or an aromatic or heteroaromatic moiety.

The term "heteroatom" as used herein means an atom of any element other than carbon or hydrogen. Preferred heteroatoms are nitrogen, oxygen, sulfur and phosphorus.

The phrase "electron donating group" is well recognized in the art and refers to those substituents which, due to electronic, inductive, and/or steric effect(s), tend to increase the charge density within the aromatic ring. Such electron donating groups include hydroxyl, amino, substituted or unsubstituted, branched or unbranched alkoxy groups, substituted or unsubstituted amide groups, and substituted or unsubstituted, branched or unbranched alkyl groups. The term "alkoxy" is well recognized in the art and refers to the basic residue of an alcohol. Similarly, the term "electron-withdrawing group" is well recognized in the art and refers to those substituents which, due to electronic, inductive, and/or steric effect(s), tend to decrease the charge density within the aromatic ring. Such electron-withdrawing groups include esters, ketones, nitrites, and halogen-containing groups. One example of an electron-withdrawing group is a hexafluoroisopropyl group. Preferably, the hexafluoroisopropyl group is located at the para position of a phenyl group.

The resin compositions useful in the invention is nonlimiting, and can be chosen from those resin binder systems currently available to those of ordinary skill in the art. For example, most commercial photoresist formulations, both positive and negative, comprise a film forming resin binder and a radiation sensitive component, e.g., a photo acid generator, (PAG). Suitable examples include, acrylate based polymers, methacrylate based polymers, cycloolefin based polymers, and novalacs.

One class of resists useful in the present invention includes polymeric binders having cyclic structure(s) within the polymer backbone of the general formula:

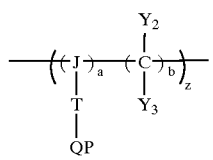

where J is a cyclic or bicyclic group and where $Y_2$ and $Y_3$, if present, are each independently hydrogen atoms, alkyl groups, e.g., methyl groups, electron withdrawing groups, e.g., halogen atoms, and a is a positive value from 1 to 100, inclusive, b is a value from 0 to 100, inclusive, and z is a positive value from 2 to 100,000 inclusive. Q is a carboxylic acid, a carbonate or a hydroxyl group. P is a protecting group for a carboxylic acid, e.g., an ester, a carbonate, or a hydroxyl group and T is a covalent bond or a bridging group having the formula:

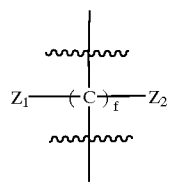

wherein $Z_1$ and $Z_1$ are each independently a hydrogen atom, an alkyl group, or an electron withdrawing group and f is a value from 0 to 6. It is understood that there can be more than one T per cyclic or bicyclic group.

The alkyl group can be substituted or unsubstituted, branched or unbranched and can include one or more degrees of unsaturation, e.g., an alkylene or an alkyne group. Suitable substituents include alkyl groups, aryl, esters, amides, amines, carboxylic acid and electron withdrawing groups known in the art. In one preferred embodiment, the alkyl group is a lower alkyl group having between one and five carbon atoms, e.g., a methyl group.

Suitable cyclic and bicyclic groups for J include, but are not limited to, cyclohexyl groups, cyclopentyl, cycloheptyl, and norbomyl. Therefore, suitable monomers include those which include at least one degree of unsaturation within the cyclic or bicyclic structure such that polymerization can occur between reactive monomers.

In addition to the hydroxyl protected polymer and photo-acid generator, small molecules which help to inhibit hydrolysis of the protected hydroxyl groups can be included in the compositions of the invention. These small molecules are typically ester, ether, ketal or acetal protected low molecular weight polyhydridic alcohols or low molecular weight alcohols. Suitable low molecular weight hydrolysis inhibitors include, for example, Di-Boc Bisphenol A, Di-Boc o-cresolphthalein, tert-butyl lithocholate and tert-butyl deoxycholate (available from Midori Kagaku Col, Ltd. Tokyo, Japan).

Phenol-based polymers useful for acid-generating compositions are known and typically include novolak and poly(vinylphenol) resins and copolymers of the same with styrene and/or alpha-methylstyrene. Novolak resins are thermoplastic condensation products of a phenol, a naphthol or a substituted phenol, such as, cresol, xylenol, ethylphenol, butylphenol, isopropyl methoxyphenol, chlorophenol, bromophenol, resorinol, naphthol, chloronaphthol, bromonaphthol or hydroquinone with formaldehyde, acetaldehyde, benzaldehyde, furfural acrolein, or the like. Suitable examples of novolak resins are disclosed in U.S. Pat. Nos. 3,148,983; 4,404,357; 4,115,128; 4,377,631; 4,423,138; and 4,424,315, the disclosures of which are incorporated herein by reference.

Another phenol-based resin for the radiation sensitive compositions of the invention are copolymers of phenols and nonaromatic cyclic alcohols analogous in structure to the novolak resins and the poly(vinylphenol) resins. Such copolymers provide radiation sensitive compositions with relatively greater transparency to activating radiation. These copolymers can be formed in several ways. For example, in the conventional preparation of a poly(vinylphenol) resin, a cyclic alcohol can be added to the reaction mixture during the polymerization reaction which is thereafter carried out in normal manner. The cyclic alcohol is preferably aliphatic, but can contain one or two double bonds. The cyclic alcohol is preferably one closest in structure to phenol. For example, if the resin is poly(vinylphenol), the comonomer would be vinyl cyclohexanol.

Poly(vinylphenol) resins are thermoplastic polymers that can be formed by block polymerization, emulsion polymerization or solution polymerization of the corresponding monomers in the presence of a cationic catalyst. Vinylphenols useful for the production of poly(vinylphenol) resins can be prepared, for example, by hydrolysis of commercially available coumarin or substituted coumarins, followed by decarboxylation of the resulting hydroxy cinnamic acids. Useful vinylphenols can also be prepared by dehydration of the corresponding hydroxy alkyl phenols or by decarboxylation of hydroxy cinnamic acids resulting from the reaction of substituted or non-substituted hydroxybenzaldehydes with malonic acid. Alternatively, polyvinyl phenol resins can be prepared by the direct polymerization of vinylphenol or by polymerizing acetoxy blocked vinyl phenol.

Other resins suitable for the practice of the invention include polymers made from polystyrene maleimides with pendant acid labile functionalities. Examples of useful polymers include those disclosed in U.S. Pat. Nos. 4,931,379, and 4,939,070, both of which are incorporated herein by reference. Vinylic polymers containing recurrent pendant group are also useful and are disclosed in U.S. Pat. No. 4,491,628, incorporated herein by reference.

Another suitable resin is polyglutarimides, prepared according to U.S. Pat. No. 4,246,374, incorporated herein by reference which are soluble in aqueous base and contain at least 40 weight percent of the nitrogen atoms of the NH or ammonia form.

Yet other suitable resin binders for use in accordance with the invention are phenol-based polymers that are partially silylated. For example, a silylated polymer is disclosed in. U.S. Pat. No. 4,791,171, the contents of which are incorporated herein by reference. This patent discloses partially silylated poly(vinylphenol) polymers prepared by derivatizing the phenolic hydroxide moieties of a poly(vinylphenol) with suitable organosilicon compounds. Such derivatization can be accomplished, for example, by condensation of a poly(vinylphenol) with an organosilicon compound that has a suitable leaving group, for example trimethylsilylmethylchloride, bromide, mesylate or tosylate; trimethylsilylchloride, bromide, cyanide or mesylate; phenyldimethylsilylchloride; or t-butyldimethylsilylchloride.

Generally, the alkali-soluble resin containing phenolic hydroxyl groups useful in the present invention can be copolymers of o-, m-, or p-hydroxystyrene or o-, m-, or p-hydroxy-alpha-methylstyrene in which the content of the styrene derivative, for example, can be at least 30 mol %, preferably at least 50 mol %, a homopolymer of any of these styrene derivatives, or a partially hydrogenated resin derived from the copolymer or homopolymer. Preferred examples of comonomers usable for the above copolymer include acrylic esters, methacrylic esters, acrylamide and analogues thereof, methacrylamide and analogues thereof, acrylonitrile, methacrylonitrile, maleic anhydride, styrene, .alpha.-methylstyrene, acetoxystyrene, and alkoxystyrenes. More preferred are styrene, acetoxystyrene, and t-butoxystyrene.

In certain embodiments the suppression agent is incorporated into the resist polymeric resist, e.g., a copolymer, tripolymer, or terpolymer. Such polymeric compositions can be prepare by standard methods known in the art such as by condensation reactions, radical addition reactions, emulsion polymerization, block polymerization, etc. Suitable examples include t-BOC p-hydroxy styrene/p-hydroxy styrene copolymers, t-butyl acrylate/p-hydroxy styrene copolymers or t-butylacrylate/p-hydroxystyrene/styrene terpolymers Specific examples of the photosensitive organic halogen compound include halogen-substituted paraffinic hydrocarbons such as carbon tetrabromide, iodoform, 1,2,3,4-tetrabromobutane and 1,1,2,2-tetrabromoethane; halogen-substituted cycloparaffinic hydrocarbons such as hexabromocyclohexane, hexachlorocyclohexane and hexabromocyclododecane; halogen-containing s-triazines such as tris(trichloromethyl)-s-triazine, tris(tribromomethyl)-s-triazine, tris(dibromomethyl)-s-triazine and 2,4-bis(tribromomethyl)-6-methoxyphenyl-s-triazine; halogen-containing benzenes such as (bis(trichloromethyl)benzene and bis(tribromomethyl)benzene; halogen-containing sulfone compounds such as tribromomethylphenylsulfone, trichloromethylphenylsulfone and 2,3-dibromosulforane; and halogen-substituted isocyanurates such as tris(2,3-dibromopropyl)isocyanurate.

The following examples serve to further describe the invention.

Experimental Data

General Process Conditions

Following resist coating of a substrate (e.g., a silicon wafer) a post application bake (PAB) was performed by placing the silicon wafer on a hot plate at the desired time and temperature. Similarly, following lithographic patterning, a post exposure bake (PEB) was performed by placing the silicon wafer on a hot plate at the desired time and temperature. Development was with either Shipley LLD-26W, a commercial resist developer or tetrahydrofuran (THF), an organic solvent. The clearing dose ($E_0$) is the lowest exposure dose required to remove all resist after development. It was determined by either fitting a line through all points containing less then 80% normalized film thickness as a function of dose and determining the intercept for zero remaining film thickness, or if no slope could be determined, by noting the lowest exposure dose for which no resist remained. The unexposed film thickness loss (UFTL) was determined by subtracting the film thickness of an unexposed portion of the resist after development from the film thickness of the resist prior to exposure. The exposed film thickness loss (EFTL) was determined by subtracting the film thickness of an exposed portion of the resist after exposure and prior to any development to from the film thickness of the resist prior to exposure. The rate of thickness loss (Rate) was determined by dividing the EFTL of a resist at a given exposure by the exposure dose.

The polymer quantum yield at 157 nm for both polymer chain scission ($\Phi_S$) and polymer crosslinking ($\Phi_X$) were determined from a slope of a least squares fit of the inverse of polymer molecular weight (both $M_n$ and $M_w$) as a function of absorbed dose employing equations 3 and 4. Accuspin Spin-On Polymer 720 (manufactured by Allied Single) was spin cast to approximately 500 nm onto a silicon wafers followed by a PAB of 195° C. for 60 seconds. The organic film of interest was then spin cast to approximately 55 nm onto the silicon wafer followed by a PAB of 130° C. for 60 seconds. The entire wafer was then exposed to 157 nm light at the desired dose. Typically 5 to 10 wafers were exposed at different doses ranging from 0 to 50 mJ/cm$^2$. After exposures the resist was stripped off the wafer in THF and the resulting solution concentrated to dryness. The dry film was resolubilized in 0.1 ml of THF and the molecular weight of the polymer was determined by gel permeation chromatography (GPC).

The following materials are referenced in this detailed description:

Polymer PMMA: poly(methyl methacrylate);
Polymer HOST: poly(p-hydroxystyrene);
Polymer TBA: poly(t-butyl acrylate);

Polymer TBMA: poly(t-butyl methacrylate);

Polymer IBMA: poly(isobomy/hexalmethacrylate);

Polymer p-HFIPS: poly(p-hexafluoroisopropylstyrene);

Polymer m-HFIPS: poly(m-hexafluoroisopropylstyrene);

Polymer HOST-co-TBA (50:50): copolymer of p-hydroxystyrene and t-butyl acrylate with a monomer ratio of 50% p-hydroxystyrene and 50% t-butyl acrylate;

Polymer HOST-co-TBA (65:35): copolymer of p-hydroxystyrene and t-butyl acrylate with a monomer ratio of 65% p-hydroxystyrene and 35% t-butyl acrylate;

Polymer HOST-co-TBMA (80:20): copolymer of p-hydroxystyrene and t-butyl methacrylate with a monomer ratio of 80% p-hydroxystyrene and 20% t-butyl acrylate;

Polymer HOST-co-MMA (51:49): copolymer of p-hydroxystyrene and methyl methacrylate with a monomer ratio of 51% p-hydroxystyrene and 49% t-butyl acrylate;

Terpolymer (65:20:15): terpolymer of p-hydroxystyrene, t-butyl acrylate, and styrene with a monomer ratio of 65% p-hydroxystyrene, 20% t-butyl acrylate, and 15% styrene;

Polymer p-HFIPS-co-TBA (60:40): copolymer of p-hexafluoroisopropyl-styrene and t-butyl acrylate with a monomer ratio of 60% p-hexafluoroisopropyl-styrene and 40% t-butyl acrylate;

Polymer p-HFIPS-co-TBMA (60:40): copolymer of p hexafluoroisopropyl-styrene and t-butyl methacrylate with a monomer ratio of 60% p-hexfluoroisopropyl-styrene and 40% t-butyl methacrylate;

Polymer m-HFIPS-co-TBMA (60:40): copolymer of m-hexafluoroisopropyl-styrene and t-butyl methacrylate with a monomer ratio of 60% m-hexafluoroisopropyl-styrene and 40% t-butyl methacrylate;

PAG TBPI-CS: di-t-butylphenyl iodonium camphor sulfonate;

PAG TBPI-FOB: t-butylphenyl iodonium perfluorobutyl sulfonate; and

Base TBAH: tetrabutyl amonium hydroxide.

EXAMPLE 1

Preparation of Homopolymer Films by Varying the Film Polymer

The film was prepared by adding the polymer in the amounts listed below to 2757 parts of propylene glycol monomethyl either solvent to make am approximately 3.5% weight of solids to total weight solution. The solution was rolled over night and filtered through a 0.2μm filter. The quantum yield for polymer chain scission and ($\Phi_s$) and polymer crosslinking ($\Phi_x$) were determined as shown in Table 1A for the below films as described in the general experimental section.

TABLE 1A

| Film | Amount | Polymer | $\Phi_s$ | $\Phi_x$ |
|---|---|---|---|---|
| PMMA | 100 | PMMA | 0.019 | 0.000 |
| HOST | 100 | HOST | 0.000 | 0.012 |
| TBA | 100 | TBA | 0.005 | 0.000 |
| IBMA | 100 | IBMA | 0.009 | 0.000 |
| TBMA | 100 | TBMA | 0.011 | 0.000 |
| p-HFIPS | 100 | p-HFIPS | 0.010 | 0.010 |
| m-HFIPS | 100 | m-HFIPS | 0.000 | 0.000 |

To determine EFTL and the rate of thickness loss, the film was spin cast to an approximately 55 nm film on a HMDS vapor primed silicon wafer followed by a PAB of 130° C. for 60 seconds. The resist was exposed to 157 nm light at a series of different doses between 0 and 200 mJ/cm². After exposure, the EFTLs and loss rates were determined at 50, 100, and 200 mJ/cm² exposure doses as shown in Table 1B.

TABLE 1B

| Film | Thickness (Å) | $EFTL_{50}$ (Å) | $EFTL_{100}$ (Å) | $EFTL_{200}$ (Å) | $Rate_{50}$ (Å/mJcm$^{-2}$) | $Rate_{100}$ (Å/mJcm$^{-2}$) | $Rate_{200}$ (Å/mJcm$^{-2}$) |
|---|---|---|---|---|---|---|---|
| PMMA | 549 | 71 | 111 | 173 | 1.4 | 1.1 | 0.9 |
| HOST | 503 | −2 | −4 | −2 | 0.0 | 0.0 | 0.0 |
| TBA | 527 | 108 | 166 | 247 | 2.2 | 1.7 | 1.2 |
| IBMA | 554 | 54 | 99 | 136 | 1.1 | 1.0 | 0.7 |
| TBMA | 558 | 110 | 169 | 267 | 2.2 | 1.7 | 1.3 |
| p-HFIPS | 542 | 10 | 15 | 18 | 0.2 | 0.2 | 0.1 |
| m-HFIPS | 535 | 1 | 1 | 15 | 0.0 | 0.0 | 0.1 |

The data provided within the above tables demonstrate that acrylic based polymers including PMMA, TBA, TBMA, and IBMA have a propensity to undergo polymer main chain scission and that the polymers do not undergo significant polymer crosslinking. HOST polymer does not undergo chain scission but instead has a tendency to undergo crosslinking. The p-HFIPS polymer can undergo both chain scission and crosslinking while the m-HFIPS polymer has no detectable chain scission nor crosslinking.

The data provided by the above tables also demonstrate that both TBA and TBMA have significant film thickness loss resulting from 157 nm exposure and that the film loss is the greatest of any homopolymer films. The PMMA and IBMA polymers also have significant film thickness loss at a rate of about 75% and 50% respectively of that of TBA and TBMA. The thickness loss can result either by main chain scission, side chain fragmentation, or a combination of both. The HOST has no EFTL even up to the highest 157 nm exposure dose. This shows that virtually no side chain fragmentation or main chain scission occurs that lead to volatile products. Both p-HFIPS and m-HST show virtually no EFTL even up to the highest 157 nm exposure dose. The lack of significant film loss also shows that the chain scission that occurs is not responsible for film loss. It is considered that the concurrent crosslinking does not allow for the production of small enough fragments to lead to material volatility or that the small value for chain scission does not allow for the production of small enough fragments to lead to material volatility or that a combination of both occur.

EXAMPLE 2

Preparation of Homopolymer and Copolymer Films by Varying the Film Polymer

The film was prepared by adding the polymer in the amounts listed below to 2757 parts of propylene glycol monomethyl either solvent to make am approximately 3.5% weight of solids to total weight solution. The solution was rolled over night and filtered through a 0.2 $\mu$m filter. The quantum yield for polymer chain scission and ($\Phi_S$) and polymer crosslinking ($\Phi_X$) were determined as shown in Table 2A for the below films as described in the general experimental section.

TABLE 2A

| Film | Amount | Polymer | $\Phi_s$ | $\Phi_x$ |
|---|---|---|---|---|
| PMMA | 100 | PMMA | 0.019 | 0.000 |
| Poly-1 | 100 | HOST-co-MMA (51:49) | 0.000 | 0.006 |
| HOST | 100 | HOST | 0.000 | 0.012 |

To determine EFTL and the rate of thickness loss, the film was spin cast to a thickness of approximately 55 nm on a HMDS vapor primed silicon wafer followed by a PAB of 130° C. for 60 seconds. The resist was exposed to 157 nm light at a series of different doses between 0 and 200 mJ/cm$^2$. After exposure, the EFTLs and loss rates were determined as shown in Table 2B at 50, 100, and 200 mJ/cm$^2$ exposure doses.

The data provided by the above tables show that PMMA has a propensity to undergo polymer main chain scission and does not undergo significant polymer crosslinking. HOST polymer does not undergo chain scission but instead has a tendency to undergo crosslinking. A copolymer of HOST and PMMA does not undergo chain scission and has a tendency to crosslink at a rate that reflects a linear combination of the amount of HOST and PMMA monomer in the polymer. Thus the HOST in the copolymer suppressed polymer chain scission.

The data provided by the above tables also show that PMMA has significant film thickness loss resulting from 157 nm exposure. The thickness loss can result either by main chain scission, side chain fragmentation, or a combination of both. The HOST has no EFTL even up to the highest 157 nm exposure dose. This shows that virtually no side chain fragmentation or main chain scission occurs that lead to volatile products. The copolymer of HOST and PMMA has an EFTL much less then one would predict if film loss were a linear function of the monomer composition of the copolymer. Thus the presence of HOST monomer in the copolymer suppresses film loss by reducing the amount of either main chain scission or side chain fragmentation.

EXAMPLE 3

Preparation of Homopolymer and Copolymer Films by Varying the Film Polymer

The film was prepared by adding polymers in the amounts listed below to 2757 parts of propylene glycol monomethyl either solvent to make a resist solution containing approximately 3.5% weight of solids to total weight solution. The solution was rolled over night and filtered through a 0.2 $\mu$m filter. The quantum yield for polymer chain scission and ($\Phi_S$) and polymer crosslinking ($\Phi_X$) were determined as shown in Table 3A for the below films as described in the general experimental section.

TABLE 3A

| Film | Amount | Polymer | $\Phi_s$ | $\Phi_x$ |
|---|---|---|---|---|
| TBA | 100 | TBA | 0.005 | 0.000 |
| Poly-2 | 100 | HOST-co-TBA (50:50) | 0.000 | 0.006 |
| Poly-3 | 100 | HOST-co-TBA (65:35) | 0.000 | 0.009 |
| HOST | 100 | HOST | 0.000 | 0.012 |
| Poly-4 | 100 | Terpolymer (65:20:15) | 0.000 | 0.009 |

To determine EFTL and the rate of thickness loss, the film was spin cast to an approximately 55 nm film on a HMDS

TABLE 2B

| Film | Thickness (Å) | EFTL$_{50}$ (Å) | EFTL$_{100}$ (Å) | EFTL$_{200}$ (Å) | Rate$_{50}$ (Å/mJcm$^{-2}$) | Rate$_{100}$ (Å/mJcm$^{-2}$) | Rate$_{200}$ (Å/mJcm$^{-2}$) |
|---|---|---|---|---|---|---|---|
| PMMA | 549 | 71 | 111 | 173 | 1.4 | 1.1 | 0.9 |
| Poly-1 | 490 | 3 | 12 | 30 | 0.1 | 0.1 | 0.2 |
| HOST | 503 | −2 | −4 | −2 | 0.0 | 0.0 | 0.0 | vapor primed silicon wafer followed by a PAB of 130° C. for 60 seconds. The resist was exposed to 157 nm light at a series of different dose between 0 and 200 mJ/cm². After exposure, the EFTLs and loss rates were determined at 50, 100, and 200 mJ/cm² exposure doses as shown in Table 3B.

TABLE 3B

| Film | Thickness (Å) | $EFTL_{50}$ (Å) | $EFTL_{100}$ (Å) | $EFTL_{200}$ (Å) | $Rate_{50}$ (Å/mJcm$^{-2}$) | $Rate_{100}$ (Å/mJcm$^{-2}$) | $Rate_{200}$ (Å/mJcm$^{-2}$) |
|---|---|---|---|---|---|---|---|
| TBA | 527 | 108 | 166 | 247 | 2.2 | 1.7 | 1.2 |
| Poly-2 | 679 | 22 | 40 | 75 | 0.4 | 0.4 | 0.4 |
| Poly-3 | 558 | 8 | 19 | 37 | 0.2 | 0.2 | 0.2 |
| HOST | 503 | −2 | −4 | −2 | 0.0 | 0.0 | 0.0 |
| Poly-4 | 636 | 2 | 6 | 17 | 0.0 | 0.1 | 0.1 |

The data contained in the above tables demonstrate that TBA has a propensity to undergo polymer main chain scission and does not undergo significant polymer crosslinking. HOST polymer does not undergo chain scission but instead has a tendency to undergo crosslinking. The copolymers of HOST and TBA do not undergo chain scission and have a tendency to crosslink at a rate that reflects a linear combination of the amount of HOST and TBA monomer in the polymer. Thus the HOST in the copolymer suppressed polymer chain scission. The terpolymer does not undergo chain scission and has a tendency to crosslink at a rate that reflects the amount of HOST in the terpolymer.

The information provided within the tables also demonstrate that TBA has significant film thickness loss resulting from 157 nm exposure. The thickness loss can result either by main chain scission, side chain fragmentation, or a combination of both. The HOST has no EFTL even up to the highest 157 nm exposure dose. This shows that virtually no side chain fragmentation or main chain scission occurs that lead to volatile products. The copolymers of HOST and TBA have an EFTL much less then one would predict if film loss were a linear function of the monomer composition of the copolymer. Thus the presence of HOST monomer in the copolymer suppresses film loss presumably by reducing the amount of either main chain scission or side chain fragmentation. The terpolymer of HOST, TBA, and styrene has an EFTL much less then one would predict based on amount of HOST and TBA in the terpolymer.

EXAMPLE 4
Preparation of Homopolymer and Copolymer Films by Varying the Film Polymer The film was prepared by adding the polymer in the amounts listed below to 2757 parts of propylene glycol monomethyl either solvent to make am approximately 3.5% weight of solids to total weight solution. The solution was rolled over night and filtered through a 0.2 μm filter. The quantum yield for polymer chain scission and ($\Phi_S$) and polymer crosslinking ($\Phi_X$) were determined as shown in Table 4A for the below films as described in the general experimental section.

TABLE 4A

| Film | Amount | Polymer | $\Phi_s$ | $\Phi_x$ |
|---|---|---|---|---|
| TBMA | 100 | TBMA | 0.011 | 0.000 |
| Poly-5 | 100 | HOST-co-TBMA (80:20) | 0.000 | 0.010 |
| HOST | 100 | HOST | 0.000 | 0.012 |

To determine EFTL and the rate of thickness loss, the film was spin cast to an approximately 55 nm film on a HMDS vapor primed silicon wafer followed by a PAB of 130° C. for 60 seconds. The resist was exposed to 157 nm light at a series of different dose between 0 and 200 mJ/cm². After exposure, the EFTLs and loss rates were determined at 50, 100, and 200 mJ/cm² exposure doses as shown in Table 4B.

TABLE 4B

| Film | Thickness (Å) | $EFTL_{50}$ (Å) | $EFTL_{100}$ (Å) | $EFTL_{200}$ (Å) | $Rate_{50}$ (Å/mJcm$^{-2}$) | $Rate_{100}$ (Å/mJcm$^{-2}$) | $Rate_{200}$ (Å/mJcm$^{-2}$) |
|---|---|---|---|---|---|---|---|
| TBMA | 558 | 110 | 169 | 267 | 2.2 | 1.7 | 1.3 |
| Poly-5 | 647 | 13 | 24 | 41 | 0.3 | 0.2 | 0.2 |
| HOST | 503 | −2 | −4 | −2 | 0.0 | 0.0 | 0.0 |

The information provided by the above tables demonstrates that TBMA has a propensity to undergo polymer main chain scission and does not undergo significant polymer crosslinking. HOST polymer does not undergo chain scission but instead has a tendency to undergo crosslinking. The copolymers of HOST and TBMA do not undergo chain scission and have a tendency to crosslink at a rate that reflects a linear combination of the amount of HOST and TBA monomer in the polymer. Thus the HOST in the copolymer suppressed polymer chain scission.-

The information provided by the above tables also demonstrates that TBMA has significant film thickness loss resulting from 157 nm exposure. The thickness loss can result either by main chain scission, side chain fragmentation, or a combination of both. The HOST has no EFTL even up to the highest 157 nm exposure dose. This shows that virtually no side chain fragmentation or main chain scission occurs that lead to volatile products. The copolymer of HOST and TBMA has an EFTL much less then one would predict if film loss were a linear function of the monomer composition of the copolymer. Thus the presence of HOST monomer in the copolymer suppresses film loss by reducing the amount of either main chain scission or side chain fragmentation.

Example 5

Preparation of Homopolymer and Copolymer Films by Varying the Film Polymer

The film was prepared by adding the polymer in the amounts listed below to 2757 parts of propylene glycol monomethyl either solvent to make am approximately 3.5% weight of solids to total weight solution. The solution was rolled over night and filtered through a 0.2 μm filter. The quantum yield for polymer chain scission and ($\Phi_S$) and polymer crosslinking ($\Phi_X$) were determined for the below films as described in the general experimental section and are shown in Table 5A. The quantum yields for copolymers containing either p-hexafluorostyrene or m-hexafluorostyrene were not obtained.

TABLE 5A

| Film | Amount | Polymer | $\Phi_s$ | $\Phi_x$ |
|---|---|---|---|---|
| TBA | 100 | TBA | 0.005 | 0.000 |
| Poly-6 | 100 | p-HFIPS-co-TBA (60:40) | NA | NA |
| p-HFIPS | 100 | p-HFIPS | 0.010 | 0.010 |
| Poly-7 | 100 | p-HFIPS-co-TBMA (60.40) | NA | NA |
| TBMA | 100 | TBMA | 0.011 | 0.000 |
| Poly-8 | 100 | m-HFIPS-co-TBMA (60:40) | NA | NA |
| m-HFIPS | 100 | m-HFIPS | 0.005 | 0.003 |

To determine EFTL and the rate of thickness loss, the film was spin cast to an approximately 55 nm film on a HMDS vapor primed silicon wafer followed by a PAB of 130° C. for 60 seconds. The resist was exposed to 157 nm light at a series of different doses between 0 and 200 mJ/cm². After exposure, the EFTLs and loss rates were determined at 50, 100, and 200 mJ/cm² exposure doses as shown in Table 5B.

TABLE 5B

| Film | Thickness (Å) | $EFTL_{50}$ (Å) | $EFTL_{100}$ (Å) | $EFTL_{200}$ (Å) | $Rate_{50}$ (Å/mJcm$^{-2}$) | $Rate_{100}$ (Å/mJcm$^{-2}$) | $Rate_{200}$ (Å/mJcm$^{-2}$) |
|---|---|---|---|---|---|---|---|
| TBA | 527 | 108 | 166 | 247 | 2.2 | 1.7 | 1.2 |
| Poly-6 | 481 | 10 | 21 | 44 | 0.2 | 0.2 | 0.2 |
| p-HFIPS | 542 | 10 | 15 | 18 | 0.2 | 0.2 | 0.1 |
| Poly-7 | 555 | 24 | 53 | 67 | 0.5 | 0.5 | 0.3 |
| TBMA | 558 | 110 | 169 | 267 | 2.2 | 1.7 | 1.3 |
| Poly-8 | 448 | 15 | 31 | 56 | 0.3 | 0.3 | 0.3 |
| m-HFIPS | 535 | 1 | 1 | 15 | 0.0 | 0.0 | 0.1 |

The information provided by the above tables also demonstrates that TBA and TBMA has significant film thickness loss resulting from 157 nm exposure. The thickness loss can result either by main chain scission, side chain fragmentation, or a combination of both. The p-HFIPS and m-HFIPS have very little EFTL even up to the highest 157 nm exposure dose. This shows that virtually no side chain fragmentation or main chain scission occurs that lead to volatile products. The copolymer of p-HFIPS and TBA has an EFTL much less then one would predict if film loss were a linear function of the monomer composition of the copolymer. Thus, the presence of p-HFIPS monomer in the copolymer suppresses film loss by reducing the amount of either main chain scission or side chain fragmentation. The copolymers of TBMA with either p-HFIPS or m-HFIPS have an EFTL much less then one would predict if film loss were a linear function of the monomer composition of the copolymers. Thus the presence of either p-HFIPS or m-HFIPS monomer in the copolymer suppresses film loss by reducing the amount of either main chain scission or side chain fragmentation.

EXAMPLE 6

Preparation of Films by Mixing Two Polymers

Films were prepared by adding polymers in the amounts (listed below in Table 6A) to 2757 parts of propylene glycol monomethyl either solvent to make am approximately 3.5% weight of solids to total weight solution. The solutions were rolled over night and filtered through a 0.2 μm filter.

TABLE 6A

| Film | Amount | Polymer 1 | Amount | Polymer 2 |
|---|---|---|---|---|
| TBA | 100 | TBA | 0 | none |
| Mix-1 | 50 | HOST | 50 | TBA |
| Poly-2 | 100 | HOST-co-TBA (50:50) | 0 | none |
| Poly-3 | 100 | HOST-co-TBA (65:35) | 0 | none |
| Mix-2 | 65 | HOST | 35 | TBA |
| HOST | 100 | HOST | 0 | none |

To determine EFTL and the rate of thickness loss, the film was spin cast to an approximately 55 nm film on a HMDS vapor primed silicon wafer followed by a PAB of 130° C. for 60 seconds. The resist was exposed to 157 nm light at a series of different dose between 0 and 200 mJ/cm². After exposure, the EFTLs and loss rates were determined at 50, 100, and 200 mJ/cm² exposure doses as shown in Table 6B.

TABLE 6B

| Film | Thickness (Å) | EFTL$_{50}$ (Å) | EFTL$_{100}$ (Å) | EFTL$_{200}$ (Å) | Rate$_{50}$ (Å/mJcm$^{-2}$) | Rate$_{100}$ (Å/mJcm$^{-2}$) | Rate$_{200}$ (Å/mJcm$^{-2}$) |
|---|---|---|---|---|---|---|---|
| TBA | 527 | 108 | 166 | 247 | 2.2 | 1.7 | 1.2 |
| Mix-1 | 554 | 18 | 34 | 53 | 0.4 | 0.3 | 0.3 |
| Poly-2 | 679 | 22 | 40 | 75 | 0.4 | 0.4 | 0.4 |
| Poly-3 | 558 | 8 | 19 | 37 | 0.2 | 0.2 | 0.2 |
| Mix-2 | 547 | 8 | 31 | 35 | 0.2 | 0.3 | 0.2 |
| HOST | 503 | −2 | −4 | −2 | 0.0 | 0.0 | 0.0 |

The information provided by the above tables also demonstrates that TBA has significant film thickness loss resulting from 157 nm exposure. The thickness loss can result either by main chain scission, side chain fragmentation, or a combination of both. The HOST has no EFTL even up to the highest 157 nm exposure dose. This shows that virtually no side chain fragmentation or main chain scission occurs that lead to volatile products. The copolymers of HOST and TBA have an EFTL much less then one would predict if film loss were a linear function of the monomer composition of the copolymer. Thus the presence of HOST monomer in the copolymer suppresses film loss by reducing the amount of either main chain scission or side chain fragmentation. The mixtures of HOST and TBA have an EFTL much less then one would predict if film loss were a linear function of the monomer composition of the mixture and that the mixture of HOST and TBA have an EFTL similar to that of the copolymer of comparable monomer ratios. Thus the presence of HOST polymer suppresses film loss from the TBA polymer when the two polymers are present in a mixture. This shows that a HOST based polymer only needs to be present in a film containing the TBA containing polymer and does not necessarily need to be incorporated as a copolymer to be effective for suppressing film loss.

EXAMPLE 7

Preparation of Films by Mixing Two Polymers

Films were prepared by adding polymers (in the amounts listed below in Table 7A) to 2757 parts of propylene glycol monomethyl either solvent to make am approximately 3.5% weight of solids to total weight solution. The solutions were rolled over night and filtered through a 0.2 μm filter.

TABLE 7A

| Film | Amount | Polymer 1 | Amount | Polymer 2 |
|---|---|---|---|---|
| PMMA | 100 | PMMA | 0 | None |
| Mix-3 | 50 | HOST | 50 | PMMA |
| Poly-1 | 100 | HOST-co-MMA (51:49) | 0 | None |
| Mix-4 | 65 | HOST | 35 | PMMA |
| HOST | 100 | HOST | 0 | None |

To determine EFTL and the rate of thickness loss, the film was spin cast to an approximately 55 nm film on a HMDS vapor primed silicon wafer followed by a PAB of 130° C. for 60 seconds. The resist was exposed to 157 nm light at a series of different doses between 0 and 200 mJ/cm². After exposure, the EFTLs and loss rates were determined at 50, 100, and 200 mJ/cm² exposure doses as shown in Table 7B.

TABLE 7B

| Film | Thickness (Å) | EFTL$_{50}$ (Å) | EFTL$_{100}$ (Å) | EFTL$_{200}$ (Å) | Rate$_{50}$ (Å/mJcm$^{-2}$) | Rate$_{100}$ (Å/mJcm$^{-2}$) | Rate$_{200}$ (Å/mJcm$^{-2}$) |
|---|---|---|---|---|---|---|---|
| PMMA | 549 | 71 | 111 | 173 | 1.4 | 1.1 | 0.9 |
| Mix-3 | 546 | 15 | 30 | 52 | 0.3 | 0.3 | 0.3 |
| Poly-1 | 490 | 3 | 12 | 30 | 0.1 | 0.1 | 0.2 |
| Mix-4 | 552 | 5 | 13 | 30 | 0.1 | 0.1 | 0.2 |
| HOST | 503 | −2 | −4 | −2 | 0.0 | 0.0 | 0.0 |

The information contained in the above tables also demonstrates that PMMA has significant film thickness loss resulting from 157 nm exposure. The thickness loss can result either by main chain scission, side chain fragmentation, or a combination of both. The HOST has no EFTL even up to the highest 157 nm exposure dose. This shows that virtually no side chain fragmentation or main chain scission occurs that lead to volatile products. The copolymers of HOST and PMMA have an EFTL much less then one would predict if film loss were a linear function of the monomer composition of the copolymer. Thus the presence of HOST monomer in the copolymer suppresses film loss by reducing the amount of either main chain scission or side chain fragmentation. The mixtures of HOST and PMMA have an EFTL much less then one would predict if film loss were a linear function of the monomer composition of the mixture and that the mixture of HOST and PMMA have an EFTL similar to that of the copolymer of comparable monomer ratios. Thus the presence of HOST polymer suppresses film loss from the PMMA polymer when the two polymers are present in a mixture. This shows that a HOST based polymer only needs to be present in a film containing the PMMA containing polymer and does not necessarily need to be incorporated as a copolymer to be effective for suppressing film loss.

EXAMPLE 8

Preparation of Films by Mixing Two Polymers

Films were prepared by adding polymers (in the amounts listed below in Table 8A) to 2757 parts of propylene glycol monomethyl either solvent to make am approximately 3.5% weight of solids to total weight solution. The solution was rolled over night and filtered through a 0.2 µm filter.

TABLE 8A

| Film | Amount | Polymer 1 | Amount | Polymer 2 |
|---|---|---|---|---|
| TBMA | 100 | TBMA | 0 | None |
| Mix-5 | 50 | HOST | 50 | TBMA |
| Mix-6 | 65 | HOST | 35 | TBMA |
| Poly-5 | 100 | HOST-co-TBMA (80:20) | 0 | None |
| HOST | 100 | HOST | 0 | None |

To determine EFTL and the rate of thickness loss, the film was spin cast to an approximately 55 nm film on a HMDS vapor primed silicon wafer followed by a PAB of 130° C. for 60 seconds. The resist was exposed to 157 nm light at a series of different doses between 0 and 200 mJ/cm$^2$. After exposure, the EFTLs and loss rates were determined at 50, 100, and 200 mJ/cm$^2$ exposure doses as shown in Table 8B.

TABLE 8B

| Film | Thickness (Å) | EFTL$_{50}$ (Å) | EFTL$_{100}$ (Å) | EFTL$_{200}$ (Å) | Rate$_{50}$ (Å/mJcm$^{-2}$) | Rate$_{100}$ (Å/mJcm$^{-2}$) | Rate$_{200}$ (Å/mJcm$^{-2}$) |
|---|---|---|---|---|---|---|---|
| TBMA | 558 | 110 | 169 | 267 | 2.2 | 1.7 | 1.3 |
| Mix-5 | 554 | 34 | 67 | 115 | 0.7 | 0.7 | 0.6 |
| Mix-6 | 557 | 34 | 49 | 82 | 0.7 | 0.5 | 0.4 |
| Poly-5 | 647 | 13 | 24 | 41 | 0.3 | 0.2 | 0.2 |
| HOST | 503 | −2 | −4 | −2 | 0.0 | 0.0 | 0.0 |

The information provided in the above tables also demonstrates that TBMA has significant film thickness loss resulting from 157 nm exposure. The thickness loss can result either by main chain scission, side chain fragmentation, or a combination of both. The HOST has no EFTL even up to the highest 157 nm exposure dose. This shows that virtually no side chain fragmentation or main chain scission occurs that lead to volatile products. The copolymers of HOST and TBMA have an EFTL much less then one would predict if film loss were a linear function of the monomer composition of the copolymer. Thus the presence of HOST monomer in the copolymer suppresses film loss by reducing the amount of either main chain scission or side chain fragmentation. The mixtures of HOST and TBMA have an EFTL much less then one would predict if film loss were a linear function of the monomer composition of the mixture. Thus the presence of HOST polymer suppresses film loss from the TBA polymer when the two polymers are present in a mixture. This shows that a HOST based polymer only needs to be present in a film containing the TBA containing polymer and does not need to be incorporated as a copolymer to be effective for suppressing film loss.

EXAMPLE 9

Preparation of Positive Acid Catalyzed Resists Varying the Resist Polymer

Resists were prepared by adding polymers, PAG, and bases (in the amounts listed below in Table 9A) to 2757 parts of propylene glycol monomethyl either solvent to make an approximately 3.5% weight of solids to total weight solution. The solutions were rolled over night and filtered through a 0.2 µm filter.

TABLE 9A

| Resist | Amount | Polymer | Amount | PAG | Amount | Base | Ratio B/P |
|---|---|---|---|---|---|---|---|
| 99110 | 96 | HOST | 4 | TBPI-CS | 0.40 | TBAH | 0.100 |
| 99111 | 96 | 65:35 | 4 | TBPI-CS | 0.40 | TBAH | 0.100 |
| 99112 | 96 | 50:50 | 4 | TBPI-CS | 0.40 | TBAH | 0.100 |

To determine EFTL and the rate of thickness loss, the films were spin cast to a thickness of approximately 55 nm on HMDS vapor primed silicon wafers followed by a PAB of 130° C. for 60 seconds. The resist was exposed to 157 nm light at a series of different doses between 0 and 200 mJ/cm$^2$. After exposure, the EFTLs and loss rates were determined at 50, 100, and 200 mJ/cm$^2$ exposure doses as shown in Table 9B.

TABLE 9B

| Resist | Thickness (Å) | EFTL$_{50}$ (Å) | EFTL$_{100}$ (Å) | EFTL$_{200}$ (Å) | Rate$_{50}$ (Å/mJcm$^{-2}$) | Rate$_{100}$ (Å/mJcm$^{-2}$) | Rate$_{200}$ (Å/mJcm$^{-2}$) |
|---|---|---|---|---|---|---|---|
| 99110 | 593 | 1 | 1 | 5 | 0.0 | 0.0 | 0.0 |
| 99111 | 564 | 7 | 19 | 37 | 0.1 | 0.2 | 0.2 |
| 99112 | 545 | 15 | 34 | 57 | 0.3 | 0.3 | 0.3 |
| 99113 | 586 | 102 | 163 | 245 | 2.0 | 1.6 | 1.2 |

The information contained within the above tables also demonstrates that TBA based resist has significant film thickness loss resulting from 157 nm exposure. The thickness loss can result either by main chain scission, side chain fragmentation, or a combination of both. The HOST based resist has no EFTL even up to the highest 157 nm exposure dose. This shows that virtually no side chain fragmentation or main chain scission occurs that lead to volatile products. The resists based on copolymers of HOST and TBA have an EFTL much less then one would predict if film loss were a linear function of the monomer composition of the copolymer. Thus the presence of HOST monomer in the copolymer suppresses film loss by reducing the amount of either main chain scission or side chain fragmentation. These film loss observed with resist formulations is very similar to that observed with polymer films showing that resist outgassing can be suppressed by the same methods used to suppress polymer outgassing.

EXAMPLE 10

Preparation of Positive Acid Catalyzed Resists Varying the Resist Polymer

Resists were prepared by adding polymers, PAGs, and bases (in the amounts listed below in Table 10A) to 2757 parts of propylene glycol monomethyl either solvent to make am approximately 3.5% weight of solids to total weight solution. The solutions were rolled over night and filtered through a 0.2 μm filter.

TABLE 10A

| Resist | Amount | Polymer | Amount | PAG | Amount | Base |
|---|---|---|---|---|---|---|
| 99114 | 96 | HOST | 4 | TBPI-FBS | 0.40 | TBAH |
| 99115 | 96 | 65:35 | 4 | TBPI-FBS | 0.40 | TBAH |
| 99116 | 96 | 50:50 | 4 | TBPI-FBS | 0.40 | TBAH |
| 99117 | 96 | TBA | 4 | TBPI-FBS | 0.40 | TBAH |

To determine EFTL and the rate of thickness loss, the film was spin cast to an approximately 55 nm film on a HMDS vapor primed silicon wafer followed by a PAB of 130° C. for 60 seconds. The resist was exposed to 157 nm light at a series of different doses between 0 and 200 mJ/cm². After exposure, the EFTLs and loss rates were determined at 50, 100, and 200 mJ/cm² exposure doses as shown in Table 10B.

The information provided by the above tables demonstrates that TBA based resist has significant film thickness loss resulting from 157 nm exposure. The thickness loss can result either by main chain scission, side chain fragmentation, or a combination of both. The HOST based resist has no EFTL even up to the highest 157 nm exposure dose. This shows that virtually no side chain fragmentation or main chain scission occurs that lead to volatile products. The resists based on copolymers of HOST and TBA have an EFTL much less then one would predict if film loss were a linear function of the monomer composition of the copolymer. Thus the presence of HOST monomer in the copolymer suppresses film loss by reducing the amount of either main chain scission or side chain fragmentation. These film loss observed with resist formulations is very similar to that observed with polymer films showing that resist outgassing can be suppressed by the same methods used to suppress polymer outgassing.

EXAMPLE 11

Preparation of Homopolymer and Copolymer Films by Varying the Film Polymer

Films were prepared by adding polymers (in the amounts listed below as shown in Table 11A) to 2757 parts of propylene glycol monomethyl either solvent to make am approximately 3.5% weight of solids to total weight solution. The solutions were rolled over night and filtered through a 0.2 μm filter. The quantum yield for polymer chain scission and ($\Phi_S$) and polymer crosslinking ($\Phi_X$) were determined for the below films as described in the general experimental section.

TABLE 11A

| Film | Amount | Polymer | $\Phi_s$ 157 | $\Phi_x$ 157 | $\Phi_s$ 248 | $\Phi_x$ 248 |
|---|---|---|---|---|---|---|
| PMMA | 100 | PMMA | 0.019 | 0.000 | 0.032 | 0.000 |
| Poly-1 | 100 | HOST-co-MMA (51:49) | 0.000 | 0.006 | 0.000 | 0.002 |
| HOST | 100 | HOST | 0.000 | 0.012 | 0.000 | 0.006 |
| Poly-3 | 100 | HOST-co-TBA (65:35) | 0.000 | 0.009 | 0.000 | 0.001 |
| TBA | 100 | TBA | 0.005 | 0.000 | 0.003 | 0.000 |

To determine EFTL and the rate of thickness loss, the film was spin cast to an approximately 55 nm film on a HMDS

TABLE 10B

| Resist | Thickness (Å) | EFTL$_{50}$ (Å) | EFTL$_{100}$ (Å) | EFTL$_{200}$ (Å) | Rate$_{50}$ (Å/mJcm$^{-2}$) | Rate$_{100}$ (Å/mJcm$^{-2}$) | Rate$_{200}$ (Å/mJcm$^{-2}$) |
|---|---|---|---|---|---|---|---|
| 99114 | 558 | 1 | 2 | 6 | 0.0 | 0.0 | 0.0 |
| 99115 | 604 | 9 | 21 | 41 | 0.2 | 0.2 | 0.2 |
| 99116 | 563 | 19 | 33 | 63 | 0.4 | 0.3 | 0.3 |
| 99117 | 662 | 151 | 216 | 301 | 3.0 | 2.2 | 1.5 | vapor primed silicon wafer followed by a PAB of 130° C. for 60 seconds. The resist was exposed to 248 nm light at a series of different dose between 0 and 2000 mJ/cm². After exposure, the EFTL and loss rate were determined at 200 and 2000 mJ/cm² exposure dose. The EFTL, and loss rate at 157 nm is also shown below in Table 11B.

TABLE 11B

| Film | Thickness (Å) | 248 nm | | 248 nm | | 157 nm | |
|------|---------------|--------|--|--------|--|--------|--|
| | | $EFTL_{2000}$ (Å) | $Rate_{2000}$ (Å/mJcm$^{-2}$) | $EFTL_{200}$ (Å) | $Rate_{200}$ (Å/mJcm$^{-2}$) | $EFTL_{200}$ (Å) | $Rate_{200}$ (Å/mJcm$^{-2}$) |
| PMMA | 573 | 10 | 0.0 | 2 | 0.0 | 173 | 0.9 |
| Poly-1 | 544 | 0 | 0.0 | −1 | 0.0 | 30 | 0.2 |
| HOST | 588 | 2 | 0.0 | 2 | 0.0 | −2 | 0.0 |
| Poly-3 | 579 | −3 | 0.0 | −5 | 0.0 | 37 | 0.2 |
| TBA | 557 | 18 | 0.0 | 2 | 0.0 | 247 | 1.2 |

The above tables show that TBA and PMMA have a propensity to undergo polymer main chain scission and do not have the tendency to undergo polymer crosslinking. HOST polymer does not undergo chain scission but instead has a tendency to undergo crosslinking. The copolymers of HOST-co-TBA and HOST-co-MMA do not undergo chain scission and have a tendency to crosslink at a rate lower then a linear combination of the amount of HOST and TBA or HOST and PMMA monomer in the polymer. Thus the HOST in the copolymer suppressed polymer chain scission at 248 nm as well as 157 nm exposure.

The above tables also show that TBA and PMMA have some film thickness loss resulting from 248 nm exposure. The thickness loss can result either by main chain scission, side chain fragmentation, or a combination of both. The HOST has no EFTL even up to the highest 248 nm exposure dose. This shows that virtually no side chain fragmentation or main chain scission occurs that lead to volatile products. The copolymers of HOST-co-TBA and HOST-co-MMA have an EFTL much less then one would predict if film loss were a linear function of the monomer composition of the copolymer. Thus the presence of HOST monomer in the copolymer suppresses film loss presumably by reducing the amount of either main chain scission or side chain fragmentation.

A comparison of the EFTL and Rate at 200 mJ/cm² for both 157 nm and 248 nm exposure shows that for TBA and PMMA almost 100 times greater EFTL occurs at 157 nm then at 248 nm. Even at a 2000 mJ/cm² dose at 248 nm the EFTL is over 10 times less then observed at 200 mJ/cm² for 157 nm exposure. This shows that the level of material loss at 248 nm is much less per equivalent dose then at 157 nm. It is believed that the much lower rate of material loss at 248 nm per equivalent dose is the reason that the effect of suppression of the material loss by the presence of aromatic materials in the polymer has not been previously reported. It is believed that the low rate of material loss at 248 nm per equivalent dose makes this invention less important at 248 nm lithography then it does with 157 nm lithography.

Those of ordinary skill in the art will know, or be able to ascertain, using no more than routine experimentation, many equivalents to the specific embodiments of the invention described herein. These and all other equivalents are intended to be encompassed by the following claims. All publications and references cited herein, including those in the background section, are expressly incorporated herein by reference in their entirety.

What is claimed is:

1. A method for performing lithography, comprising applying a resist composition comprising a mixture of a resist polymer and an aromatic polymer to a substrate surface, and exposing selected portions of the applied resist to radiation having a wavelength less than about 157 nm, wherein said aromatic polymer is a radical scavenger present in the mixture to stabilize radicals formed upon exposure to radiation so as to reduce outgassing of volatile components of the resist upon exposure of the resist to radiation.

2. The method of claim 1, wherein the aromatic polymer reduces chain scission within the photoresist composition.

3. The method of claim 1, wherein the aromatic polymer is present in the mixture in a range between about 5 percent and about 95 percent based on the weight of the total composition.

4. The method of claim 1, wherein the aromatic polymer is present in the mixture in a range of between about 20 percent and about 90 percent based on the weight of the total composition.

5. The method of claim 1, wherein the aromatic polymer further comprises an electron donating group selected from the group consisting of hydroxyl, amino, substituted and unsubstituted, branched and unbranched alkoxy groups, substituted and unsubstituted amide groups, substituted and unsubstituted aryl groups and substituted and unsubstituted, branched and unbranched alkyl groups.

6. The method of claim 5, wherein the electron donating group is a hydroxyl group.

7. The method of claim 1, wherein the aromatic polymer further comprises an electron withdrawing group.

8. The method of claim 7, wherein the electron withdrawing group is a hexafluoroisopropyl group.

9. The method of claim 1, wherein the method further comprises using the resist for photolithography at a wavelength of about 157 nm.

10. The method of claim 1, wherein the photoresist composition is selected from the group consisting of cycloolefins, poly-t-butyl esters, polyacrylates, polymethacrylates, and polymethylmethacrylates.

11. A positive 157 nm resist, comprising a non-aromatic photoresist polymer, and an aromatic polymer that is a radical scavenger for stabilizing radicals, thereby suppressing outgassing of volatile components of the resist, upon exposure of the resist to radiation, wherein said non-aromatic and aromatic polymers form a mixture.

12. The resist of claim 11, wherein the aromatic polymer is present in the mixture in a range of between 5 percent and about 95 percent based on the weight of the total composition.

13. The resist of claim 11, wherein the aromatic polymer is present in the mixture in a range of between about 20 percent and about 90 percent based on the weight of the total composition.

14. The resist of claim 11, wherein aromatic polymer further comprises at least one electron donating group selected from the group consisting of hydroxyl, amino, substituted or unsubstituted, branched or unbranched alkoxy groups, substituted or unsubstituted amide groups, substituted or unsubstituted aryl groups and substituted or unsubstituted, branched or unbranched alkyl groups.

15. The resist of claim 14, wherein the electron donating group is a hydroxyl group.

16. The resist of claim 11, wherein the aromatic polymer further comprises at least one electron withdrawing group.

17. The resist of claim 16, wherein the electron withdrawing group is a hexafluoroisopropyl group.

18. The resist of claim 11, wherein the photoresist polymer is selected from the group consisting of cyclo-olefins, poly-t-butyl esters, polyacrylates, polymethacrylates, and polymethylmethacrylates.

19. An extreme ultraviolet resist, comprising
  a resist composition having a non-aromatic photoresist polymer and being capable of lithographic patterning by radiation at a wavelength below 100 nanometers, and
  an aromatic polymer mixed with said resist composition, said aromatic polymer being a radical scavenger to stabilize radicals formed upon exposure to radiation so as to suppress outgassing of volatile components of the resist upon exposure of the resist to radiation.

20. The resist of claim 19, wherein the aromatic polymer is present in the mixture in a range of between about 5 percent and about 95 percent based on the weight of the total resist.

21. The resist of claim 20, wherein the electron donating group is a hydroxyl group.

22. The resist of claim 20, wherein aromatic polymer further comprises at least one electron withdrawing group.

23. The resist of claim 22, wherein the electron withdrawing group is a hexafluoroisopropyl group.

24. The resist of claim 19, wherein the aromatic polymer is present in the mixture in a range of between about 20 percent and about 90 percent based on the weight of the total resist.

25. The resist of claim 19, wherein the aromatic polymer further comprises at least one electron donating group selected from the group consisting of hydroxyl, amino, substituted or unsubstituted, branched or unbranched alkoxy groups, substituted or unsubstituted amide groups, substituted or unsubstituted aryl groups and substituted or unsubstituted, branched or unbranched alkyl groups.

26. The resist of claim 19, wherein the photoresist composition is selected from the group consisting of cyclo-olefins, poly-t-butyl esters, polyacrylates, polymethacrylates, and polymethylmethacrylates.

27. An electron beam resist, comprising
  a resist composition including a non-aromatic photoresist polymer and being capable of lithographic patterning by electron beam radiation, and
  an aromatic polymer mixed with said resist composition, wherein said aromatic polymer is a radical scavenger that stabilizes radicals formed upon exposure to radiation so as to suppress outgassing of volatile components of the resist upon exposure of the resist to radiation.

28. The resist of claim 27, wherein the aromatic polymer is present in the mixture in a range of between about 5 percent and about 95 percent based on the weight of the total resist.

29. The resist of claim 27, wherein the aromatic polymer is present in the mixture in a range of between about 20 percent and about 90 percent based on the weight of the total resist.

30. The resist of claim 27, wherein the aromatic polymer further comprises at least one electron donating group selected from the group consisting of hydroxyl, amino, substituted or unsubstituted, branched or unbranched alkoxy groups, substituted or unsubstituted amide groups, substituted or unsubstituted aryl groups and substituted or unsubstituted, branched or unbranched alkyl groups.

31. The resist of claim 30, wherein the electron donating group is a hydroxyl group.

32. The resist of claim 27, wherein aromatic polymer further comprises at least one electron withdrawing group.

33. The resist of claim 32, wherein the electron withdrawing group is a hexafluoroisopropyl group.

34. The resist of claim 27, wherein the photoresist composition is selected from the group consisting of cyclo-olefins, poly-t-butyl esters, polyacrylates, polymethacrylates, and polymethylmethacrylates.

35. An advanced positive lithography resist, comprising a radiation sensitive polymeric composition incorporating a mixture of a non-aromatic photoresist polymer and an aromatic polymer having an electron withdrawing group and functioning as a radical scavenger for stabilizing radicals formed upon exposure to radiation so as to suppress outgassing of volatile components of the resist upon exposure of the resist to radiation.

36. The resist of claim 35, wherein the aromatic unit further comprises an electron donating group selected from the group consisting of hydroxyl, amino, substituted or unsubstituted, branched or unbranched alkoxy groups, substituted or unsubstituted amide groups, substituted or unsubstituted aryl groups and substituted or unsubstituted, branched or unbranched alkyl groups.

37. The resist of claim 36, wherein the electron donating group is a hydroxyl or a hexafluoroisopropyl group.

38. The resist of claim 35, wherein aromatic polymer further comprises at least one electron withdrawing group.

39. The resist of claim 38, wherein the electron withdrawing group is a hexafluoroisopropyl group.

40. The resist of claim 35, wherein the polymeric photoresist comprises a polymeric backbone that includes monomeric units selected from the group consisting of cyclo-olefins, poly-t-butyl esters, polyacrylates, polymethacrylates and polymethylmethacrylates.

41. An advanced positive lithography resist, comprising a radiation sensitive polymeric composition incorporating a sufficient amount of an aromatic compound such that the aromatic compound suppresses outgassing of volatile components of the composition upon exposure of the resist to radiation wherein the aromatic unit is present within the polymeric backbone in a range between about 1 percent and about 95 percent based on the weight of the total composition.

42. An advanced positive lithography resist, comprising a radiation sensitive polymeric composition incorporating a sufficient amount of an aromatic compound such that the aromatic compound suppresses outgassing of volatile components of the composition upon exposure of the resist to radiation wherein the aromatic unit is present within the polymeric backbone in a range of between about 20 percent and about 90 percent based on the weight of the total composition.

43. A method for performing lithography, comprising
   applying a resist composition comprising a mixture of a non-novolak polymer and an aromatic polymer that stabilizes radicals formed upon exposure of the resist to radiation to a substrate surface, and
   exposing selected portions of the applied resist to radiation having a wavelength less than about 200 nm,
   wherein the aromatic polymer reduces outgassing of volatile components of the resist during exposure of the resist to radiation.

44. The method of claim 43, further comprising selecting said radiation having a wavelength less than about 200 nm to be 157 nm radiation.

45. The method of claim 43, further comprising selecting said radiation having a wavelength less than about 200 nm to have a wavelength in a range of about 10 to about 20 nm.

46. A sub-200 nm resist, comprising
   a non-novolak photoresist polymer, and
   an aromatic polymer mixed with said photoresist polymer,
   wherein said aromatic polymer is a radical scavenger that stabilizes radicals formed upon exposure to radiation so as to suppress outgassing of volatile components of the resist upon exposure of the resist to sub-200 nm radiation.

* * * * *